SEMICONDUCTOR TRANSLATING DEVICE

Filed Feb. 18, 1950

INVENTORS L. A. MEACHAM
S. E. MICHAELS
BY [signature]
ATTORNEY

Patented Feb. 3, 1953

2,627,575

UNITED STATES PATENT OFFICE 2,627,575

SEMICONDUCTOR TRANSLATING DEVICE

Larned A. Meacham, New Providence, and Simon Eugene Michaels, Brookside, N. J., assignors to Bell Telephone Laboratories, Incorporated, New York, N. Y., a corporation of New York Application February 18, 1950, Serial No. 144,884

8 Claims. (Cl. 250—31)

This invention relates to semiconductor translating devices and, more particularly, to germanium amplifiers of the general type disclosed in the application Serial No. 33,466, filed June 17, 1948, of J. Bardeen and W. H. Brattain now Patent 2,524,035 granted October 3, 1950, and known as transistors.

Transistors comprise, in general, a body of semiconductive material and emitter, collector and base connections to the body. The emitter and collector may be point contacts bearing against the body and in close proximity to one another. In the operation of such devices, the emitter is biased in the forward direction and the collector is biased in the reverse direction, relative to the body. Signals are impressed upon the emitter and amplified replicas thereof are obtained at the collector. Both power and current gains are obtainable.

One object of this invention is to realize large current gains for semiconductor translating devices, and particularly for germanium amplifiers.

Another object of this invention is to simplify the structure of such devices.

A further object of this invention is to facilitate the resolution of signal pulses or groups thereof, representative of signal amplitudes, for example, as in pulse code modulation (PCM) and pulse position modulation (PPM) communication systems, into signals of amplitudes corresponding to those represented by the pulses or groups of pulses.

The invention is predicated in part upon the discovery that under certain conditions abrupt and short variations in the electric fields effective upon a semiconductive body at or in the immediate vicinity of a rectifying connection thereto produce marked, reproducible alterations in the conduction characteristics whereby large current yields are attainable. More specifically, and for example, in a germanium device, it has been found that if, with a certain emitter current flowing, a voltage pulse with a steep leading edge is applied to the collector, the collector current is characterized by an initial burst of amplitude many times as great as the emitter current. Similar results are obtained by pulsing the emitter connection in like manner, that is, utilizing this connection first as an emitter and then as a collector.

One broad feature of this invention, then, involves controlled variation of the potentials applied to a semiconductor translating device at or in proximity to a rectifying connection thereto to realize large output currents. More specifically, in accordance with one feature of this invention, an emitter current of prescribed magnitude is caused to flow and a voltage pulse, of the order of a microsecond in duration and of the reverse polarity, is applied to the collector, or to the emitter operated as a collector, whereby bursts of collector current are realized. In typical and illustrative devices described in detail hereinafter, for normal emitter currents of one milliampere, collector currents of the order of 24 milliamperes and greater have been obtained.

The invention and the above-noted and other features thereof will be understood more clearly and fully from the following detailed description with reference to the accompanying drawing in which.

Figures 1, 2, 3, 5:
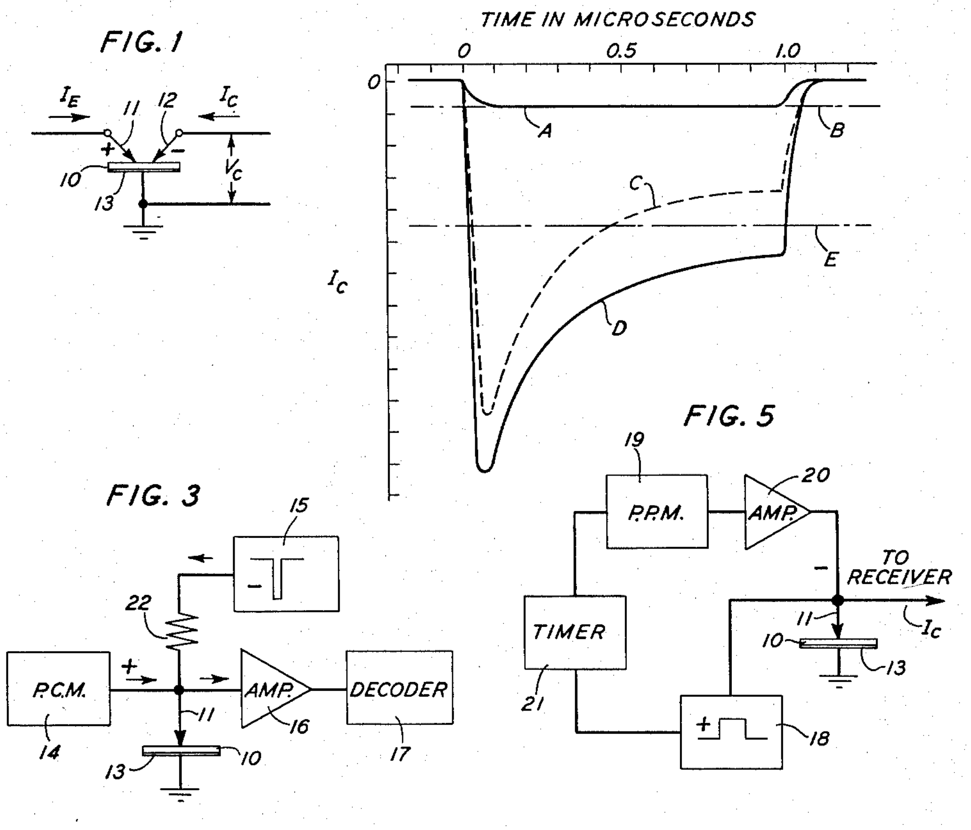
Fig. 1 is a diagram illustrating the principal components of a semiconductor translating device of the type to which this invention pertains, certain operational parameters being indicated therein.
Fig. 2 is a graph illustrating typical operating characteristics of devices constructed in accordance with this invention.
Fig. 3 is a block diagram showing a PCM receiver including a translating device illustrative of this invention.
Fig. 5 is a block diagram illustrating a PPM translator including a semiconductor device in accordance with this invention.

Referring now to the drawing, the signal translating device illustrated in Fig. 1 comprises a body 10 of semiconductive material, a pair of point contacts 11 and 12 constituting the emitter and collector, respectively, bearing against one face of the body 10, and a large area substantially ohmic connection 13, constituting the base, to the opposite face of the body 10. In an illustrative device, the body 10 may be of a high back voltage N conductivity type germanium produced, for example, as disclosed in the application Serial No. 638,351, filed December 29, 1945, Patent No. 2,602,211 granted July 8, 1952, of J. H. Scaff and H. C. Theuerer. The point contact emitter and collector may be of phosphor bronze spaced of the order of .002 inch, and the base connection 13 may be a copper or rhodium plating upon the body 10.

In general, the emitter 11 is biased at a relatively small voltage in the forward direction relative to the base, and the collector 12 is biased in the reverse direction at a relatively high voltage with respect to the base 13. As indicated in Fig. 1, if the body is of N conductivity type material, the emitter 11 is biased positive and the collector is biased negative. In typical devices wherein the body is of high back voltage N type germanium, the emitter bias may be of the order of one volt or less, and the collector bias may be of the order of 10 volts. It will be understood, of course, that if the body is of P conductivity type material, the polarity of the biases will be the reverse of that indicated in Fig. 1.

Operating parameters of the device which will be referred to hereinafter are, as indicated in Fig. 1, the emitter current $I_E$, the collector current $I_C$, and the collector voltage $V_C$.

Typical performance characteristics of a translating device of the specific construction above set forth, and operated in accordance with this invention are depicted in Fig. 2, wherein time is plotted an abscissae and collector current $I_C$ is plotted as ordinates. For a normal emitter current of zero, if a substantially square voltage pulse of 10 volts negative and of one microsecond duration is applied to the collector, the collector current varies as illustrated by curve A, the maximum collector current being in typical cases a fraction of a milliampere. The steady state collector current, for the emitter biased so that the normal emitter current is zero, and the collector biased at 10 volts negative, is indicated by line B in Fig. 2.

If now the bias upon the emitter is made such that the normal emitter current is one milliampere, for a collector voltage of 10 volts negative, the steady state current is as indicated by the line E. If the emitter current of one milliampere is pulsed off at time O and simultaneously a collector potential of 10 volts negative is applied, the collector potential being a square pulse of one microsecond duration, the collector current varies with time in the manner illustrated by curve C, that is, there is an initial burst of current and then a decay toward the steady state value.

If the emitter current is left at a fixed value, say one milliampere, and then a square voltage pulse negative and of one microsecond duration, and of 10 volts magnitude, is applied to the collector, the collector current varies as illustrated by curve D. Again, in this case, there is an initial burst of collector current followed by a decay toward the steady state value.

The amplitude of the initial burst of collector current, such as is obtained in the conditions represented by curves C and D in Fig. 2, is many times that of the emitter current. In typical cases, for example, wherein the body 10 was of N type germanium and the emitter current was one milliampere, the peak amplitude of the collector current was 24 milliamperes or higher. Thus, it will be appreciated that operation of the translating device in the manner corresponding to curves C and D enables realization of collector current pulses of relatively high amplitude.

The behavior evidenced by the curves of Fig. 2 may be explained upon the basis of the injection of charges from the emitter into the semiconductive body and the storage of these charges in the body. The charges injected are of the polarity opposite that of those normally present in excess in the semiconductor. Specifically, and an as an example, if the body is of N conductivity type germanium, holes are injected from the emitter into the germanium. Some of these holes, which have the characteristic of positive charges, combine with excess electrons normally present in the body. However, others remain uncombined and, in effect, may be considered as stored in the body. When the collector potential is applied, there is an initial rush of holes to, or rapid gathering thereof by, the collector and a consequent burst of current in the collector circuit. As the holes are removed, the collector current decreases until, assuming the emitter is still in circuit, the steady state condition is reached. At this condition, injection of holes at the emitter and withdrawal thereof at the collector occur concomitantly and at substantially uniform rates. Of course, as is now known, arrival of a single hole at the collector may result in the passage of more than one electron through the collector circuit so that current multiplication is obtained.

If the body is of P conductivity type material, the charges normally present are holes, and the injected and stored charges are electrons.

It will be appreciated that the magnitude of the peak reverse or collector current obtainable is dependent upon, inter alia, the timing of the flow of emitter current with respect to the application of the reverse voltage pulse and upon the hole-electron recombination rate for the semiconductive material. As an example, for high back voltage N type germanium prepared as disclosed in the application of Scaff and Theuerer, hereinabove identified, the peak reverse current increases exponentially toward an asymptotic value as the duration of flow of emitter current is increased. On the other hand, it decreases exponentially toward the steady state value corresponding to zero emitter current as the interval between the termination of the flow of emitter current and the onset of the reverse voltage is increased. In a typical germanium device, the time constants of both of these exponential characteristics were found to be of the order of a microsecond, although it will be understood that such characteristics, being affected by the rates of hole injection and of hole-electron recombination, are amenable to specific design and manufacturing control.

The characteristics portrayed in Fig. 2 are those actually obtained for devices of the construction illustrated in Fig. 1 and including two point contacts to the semiconductor body. Essentially similar characteristics have been realized with devices including but a single point contact connection to the body, this connection being utilized alternately as an emitter and a collector. Advantageously, the contact is formed electrically, as disclosed in the applications referred to heretofore.

Figure 4:
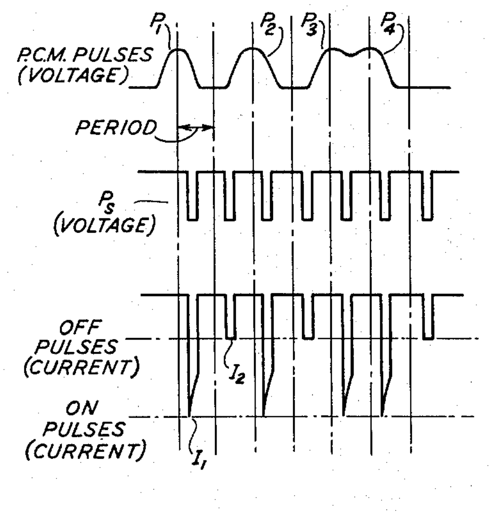
Fig. 4 depicts graphically the operation of the translating device in the receiver shown in Fig. 3.

Devices constructed in accordance with this invention may be utilized to advantage in receivers in pulse code modulation communication systems. The general organization and operation is illustrated in Figs. 3 and 4. As shown in the former figure, a source of PCM pulse trains or groups 14 and a source of sharp, for example, one microsecond duration, pulses 15 are connected to the point contact 11 to the semiconductor body, the connection from the source 15 being through a high resistance 22. The sources 14 and 15 produce pulses of such polarities that pulses from the former inject carriers into the body 10, and the pulses from the source 15 drive the potential of the point contact 11 in the direction to remove the stored charges. Thus, if the body 10, in the embodiment illustrated in Fig. 3, is of N conductivity type material, the pulses from the source 14 will be positive, and the pulses from the source 15 will be negative. The latter voltage pulses may be of the amplitude corresponding to the collector pulses which yielded the current pulses depicted in Fig. 2.

An output or collector current is obtained from the semiconductive translating device, fed to an amplifier 16, and thence to a decoder 17 which may be of well-known construction. In some cases, the amplifier may be omitted.

Referring now to Fig. 4, a train of PCM pulses is indicated, together with a series of seeing pulses $P_s$ generated by the source 15. One seeing pulse is applied to the contact 11 for each period, as indicated, the seeing pulse occurring at substantially the same time in each period. Consider now the train of PCM pulses at the time of the application of the first seeing pulse, that is, the pulse depicted at the extreme left in Fig. 4. The signal pulse $P_1$ has charged the semiconductor body 10. Hence, upon the application of this seeing pulse, a large burst of current, indicated at $I_1$, is obtained and fed to the decoder 17 through the amplifier 16. At the time of application of the second seeing pulse, which is shown as being at about the beginning of the application of the second PCM pulse $P_2$, but little storage of charges has occurred in the semiconductor body, nor does an appreciable residue of charges from pulse $P_1$ remain. Hence, the output current obtained is of relatively small amplitude, as indicated at $I_2$. For the two closely succeeding PCM pulses $P_3$ and $P_4$, at the time of the respective seeing pulses substantial charge has been stored in the semiconductor body so that, as illustrated in Fig. 4, large output currents are realized.

Each code group of output pulses obtained from the PCM system is integrated with suitable weighting by the decoder 17 and resolved thereby into an output signal of amplitude proportional to the signal sample represented by the corresponding input pulse train.

It will be appreciated that the output currents obtainable from the organization illustrated in Fig. 3 are very large because of the current multiplication realized by virtue of the action depicted in Fig. 2 and heretofore explained. The seeing pulses advantageously should be of extremely short duration, for example, of the order of 0.5 microsecond.

Figure 6:
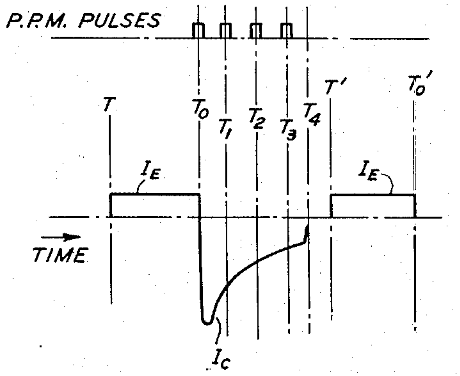
Fig. 6 illustrates graphically principles of operation of the translator shown in Fig. 5.

The invention may be utilized to advantage also in receivers in the pulse position modulation type of communication system. The general organization and operation are illustrated in Figs. 5 and 6. In the combination illustrated in Fig. 5, as in that illustrated in Fig. 3, positive and negative voltage pulses are applied through the point contact 11 to the semiconductor body. The charging pulses which, it will be understood, are positive in the case of an N conductivity type body 10, are applied from a source 18. The collector pulses, which are negative for the case under consideration, are applied from the source of PPM signals 19 via an amplifier 20. The sources 18 and 19 are synchronized, as by a timer 21, so that the periods of application of pulses from the sources 18 and 19 are in alternate relation.

Specifically, as illustrated in Fig. 6, charging pulses are applied to the contact 11 from the source 18 for alternate periods, such as $TT_0$ and $T'T'_0$. In the intervening period, a PPM pulse is applied to the contact 11. If the PPM pulse is of such position in the time cycle that it is applied at or about time $T_0$, it will be appreciated that the collector current supplied to the receiver will be of substantially maximum amplitude. If the pulse occurs in the latter part or toward the end of the interval between the pulses, the collector current supplied to the receiver will be small, for example, of the amplitude corresponding to the pulse position time $T_4$. For pulses applied at intermediate times, such as at $T_1$, $T_2$, and $T_3$, the collector current supplied to the receiver will be of intermediate amplitudes, decreasing as the time increases. Thus, it will be appreciated the current supplied to the receiver will be a function of the time at which the PPM pulse is applied to the point contact 11 and, consequently, a measure of the amplitude of the signal represented by that pulse.

Although specific embodiments of the invention have been illustrated and described, it will be understood that they are but illustrative and that various modifications may be made therein without departing from the scope and spirit of this invention.

What is claimed is:

1. A translating device comprising a body of semi-conductive material, a rectifying connection to said body, a base connection to said body, an output circuit coupled to said rectifying connection, means for injecting into said body, in the vicinity of said connection, electrical carriers of the polarity opposite that of those normally present in excess in said body, and means for applying voltage pulses in the reverse direction to said rectifying connection.

2. A translating device comprising a body of semi-conductive material, a rectifying connection to said body, a base connection to said body, means for energizing said rectifying connection to inject into said body electrical carriers of the polarity opposite that of those normally present in said body, and means for applying voltage pulses in the reverse direction to said rectifying connection.

3. A translating device comprising a body of germanium, emitter, collector, and base connections to said body, input circuit means including a source, connected between said emitter and base for establishing a flow of current in the forward direction between said emitter and base connections, and output circuit means connected between said collector and base connections for applying voltage pulses in the reverse direction to said collector connection.

4. A translating device comprising a body of N type germanium, means for making a rectifying connection to said body, means for energizing said connection to inject holes into said body, and an output circuit coupled to said connection and body and including means for periodically pulsing said connection in the reverse direction.

5. A translating device comprising a body of N conductivity type germanium, a point contact bearing against one face of said body, a base connection to said body, means for applying to said contact a relatively low voltage positive with respect to said base connection, and means for applying to said body, in the immediate vicinity of said point contact, relatively large voltage pulses negative with respect to said base.

6. A translating device comprising a body of N conductivity type germanium, a point contact bearing against said body, a base connection to said body, a first source means connected to said contact for applying thereto voltage pulses of one polarity relative to said base connection, and a second source means connected to said contact for applying thereto voltage pulses of the opposite polarity relative to said base connection.

7. A translating device comprising a body of semi-conductive material, a rectifying connection to said body, a base connection to said body, means including a source of PCM signals connected to said rectifying connection for applying thereto pulses of the polarity relative to said body to cause flow of current in the forward direction through said rectifying connection, and means including a source for applying voltage pulses in the reverse direction periodically to said rectifying connection.

8. A translating device comprising a body of semi-conductive material, a rectifying connection to said body, a base connection to said body, means including a source of PPM signals connected to said rectifying connection for applying thereto voltage pulses in the reverse direction, and means including a source connected to said connection for applying thereto periodically voltage pulses in the forward direction.

LARNED A. MEACHAM.
S. EUGENE MICHAELS.

REFERENCES CITED

The following references are of record in the file of this patent:

UNITED STATES PATENTS

| Number | Name | Date |
|---|---|---|
| 2,391,776 | Fredendall | Dec. 25, 1945 |
| 2,476,323 | Rack | July 19, 1949 |
| 2,486,776 | Barney | Nov. 1, 1949 |